United States Patent [19]
Nishimura

[11] Patent Number: 5,388,117
[45] Date of Patent: Feb. 7, 1995

[54] POLARIZATION INSENSITIVE SEMICONDUCTOR OPTICAL AMPLIFIER AND AN OPTICAL COMMUNICATION SYSTEM USING THE SAME

[75] Inventor: Michiyo Nishimura, Sagamihara, Japan

[73] Assignee: Canon Kabushiki Kaisha, Tokyo, Japan

[21] Appl. No.: 194,273

[22] Filed: Feb. 10, 1994

[30] Foreign Application Priority Data

Feb. 19, 1993 [JP] Japan .................................. 5-054983

[51] Int. Cl.⁶ .......................... H01S 3/19; H04B 10/12; G02B 6/12
[52] U.S. Cl. ...................................... 372/45; 359/344; 359/485; 359/122; 359/156; 385/11; 372/27; 257/18
[58] Field of Search ............................ 372/45, 46, 27; 359/333, 344, 485, 122, 156; 385/11; 257/12–15, 17, 18

[56] References Cited

U.S. PATENT DOCUMENTS

| | | | |
|---|---|---|---|
| 5,151,818 | 9/1992 | Thijs et al. | 359/344 |
| 5,309,275 | 5/1994 | Nishimura et al. | 359/344 |
| 5,334,854 | 8/1994 | Ono et al. | 372/45 |

FOREIGN PATENT DOCUMENTS

| | | |
|---|---|---|
| 0463569 | 1/1992 | European Pat. Off. |
| 0469681 | 2/1992 | European Pat. Off. |
| 1251685 | 10/1989 | Japan . |
| 1257386 | 10/1989 | Japan . |
| 427183 | 1/1992 | Japan . |

OTHER PUBLICATIONS

Magari, et al., "1.55 μm Polarization–Insensitive High-Gain Tensile–Strained–Barrier MQW Optical Amplifier," *IEEE Photonics Technology, Letters,* Dec. 3, 1991, No. 11.

Joma, et al., "Polarization insensitive semiconductor laser amplifiers with tensile strained InGaAsP/InGaAsP multiple quantum well structure," *Applied Physics Letters,* 62 Jan. 11, 1993, No. 2.

Yaguchi, et al., "Photoreflectance Study of GaAs/GaAsP Strained–Barrier Quantum Well Structures," *Extended Abstracts of the 1992 International Conference on Solid State Devices and Materials,* 1992, pp. 589–591 No Month.

*Primary Examiner*—Georgia Y. Epps
*Attorney, Agent, or Firm*—Fitzpatrick, Cella, Harper & Scinto

[57] ABSTRACT

A polarization insensitive optical amplifying apparatus having a semiconductor laser structure, and serving as an amplifier for imparting a gain to input light from outside the apparatus. In the optical amplifying apparatus, a second semiconductor layer is formed on at least a first semiconductor layer. The lattice constant of the second semiconductor layer is less than the lattice constant of the first semiconductor layer. The second semiconductor layer undergoes a biaxial tensile stress due to a lattice mismatch between the first and second semiconductor layers, and serves as a well layer of an active layer having a quantum well structure. A third semiconductor layer is also formed on at least the first semiconductor layer. The lattice constant of the third semiconductor layer is less than the lattice constant of the first semiconductor layer. The third semiconductor layer also undergoes a biaxial tensile stress due to a lattice mismatch between the first and third semiconductor layers, and serves as a barrier layer of the active layer having the quantum well structure.

14 Claims, 11 Drawing Sheets

POLARIZATION INSENSITIVE SEMICONDUCTOR OPTICAL AMPLIFIER AND AN OPTICAL COMMUNICATION SYSTEM USING THE SAME

BACKGROUND OF THE INVENTION

1. Field of the Invention

The present invention relates to a polarization insensitive semiconductor optical amplifier or amplifying apparatus and an optical communication system or network using this optical amplifier.

2. Related Background Art

Generally, a semiconductor optical amplifier or an amplifying apparatus comprises a semiconductor laser structure including an active layer and a cladding layer, and amplifies an input light by means of a bias current, below a threshold, injected into the laser structure. In the optical communication field, the optical amplifier has been developed as a device for compensating for an optical loss that occurs in optical fibers or at connections between optical fibers.

However, there has been the problem of a polarization dependency of the optical amplification factor (i.e. the optical amplification factor differs depending on the different polarization modes of an input light) when a semiconductor optical amplifier is used in optical fiber communication systems. Generally, the state of polarization of an output light, which is transmitted through the optical fiber, is unstable, so the level of an output light from the optical amplifier will not be stable when such light from the optical fiber is input into such an amplifier having the above-discussed polarization dependency. Further, the fluctuation of such output burdens a light receiving system regarding its dynamic range and the like. This is a vital drawback which limits the scale of the communication system.

Therefore, various conventional methods of fabricating a polarization insensitive optical amplifier have been performed. Among them, a method of using a strain quantum well structure is proposed as a method for solving the polarization dependency of optical gain in the active layer. The strain quantum well structure is used for both controlling the oscillation wavelength and reducing an oscillation threshold gain in the field of semiconductor lasers, and thus this structure is a remarkably useful technique.

Generally, in order to utilize a strain quantum well structure as a polarization insensitive optical amplifier, the gain for TM mode light is equalized with or made larger than that for TE light. More in particular, the degeneracy in a valence band is solved by the effect of strain, and hence band structures of heavy and light holes are respectively shifted. Thus, the energy gap between the ground level of electrons in the conduction band and the level of heavy holes in the valence band is approximately made equal with or made slightly larger than the energy gap between the ground level of electrons in the conduction band and the level of light holes in the valence band. When there is no polarization dependency of gain other than that of the optical gain, those energy gaps are equalized with each other. When there exists a gain dependency on polarization that is other than that of the optical gain, the latter energy gap, concerning the light holes, is made smaller. In general, optical confinement for TE light is larger than that for TM light, so the latter energy gap, concerning the light holes, is made smaller when considering such difference in optical confinement.

Several methods have been proposed for creating the strain necessary for obtaining the above-discussed desired energy levels.

First, a method for imparting a biaxial tensile stress to a well structure is proposed as disclosed in Japanese Patent Laid-Open Application No. 1-251685 (1989). On a reference first semiconductor layer (i.e. a substrate or a cladding layer), a second semiconductor layer, having a lattice constant smaller than that of the first semiconductor layer, is formed. Hence a biaxial tensile stress is imparted to the second semiconductor layer. The energy level of the light holes in the valence band is shifted in a direction for narrowing its band gap, by imparting the biaxial tensile stress to the well layer. As a result, the energy level of light holes in the valence band approaches the energy level of heavy holes in the valence band, and hence a desired energy level is obtained.

Second, a method for imparting a biaxial tensile stress to a barrier layer is proposed as disclosed in Japanese Patent Laid-Open Application No. 4-27183 (1992). Similar to the first method, an energy level of light holes in a valence band of the barrier layer is shifted. As a result, a well for the light holes is shallowed, leading to a shift in the energy level, and a desired level results.

Third, a method of fabricating an active layer having a strained well layer (a biaxial tensile stress exists) and a non-strained well layer is proposed as described in Japanese Patent Laid-Open Application No. 1-257386 (1989).

However, those prior art methods have respectively their own advantages and disadvantages. The first prior art method has an advantage in that a relatively large amount of energy shift can be obtained by a slight strain amount and thus a desired effect can be achieved by a relatively small amount of strain. On the other hand, an energy shift of the conduction band occurs simultaneously with an energy shift of the valence band due to the effect of strain. Conversely, the second prior art method has a drawback in that a relatively large amount of strain is needed, compared to the first prior art method, to attain a desired effect, although the wavelength, at which a gain is obtained, hardly changes.

The third prior art method has an advantage in that freedom in design is increased by the combination of two well layers and a desired effect can be readily obtained. However, the amount of strain needs to be increased, compared to the first prior art method.

A semiconductor optical amplifier is used for amplifying a signal light generated by driving a semiconductor laser, and this amplifier can be replaced by a structure resembling the semiconductor laser. If a wavelength range of gain of the amplifier largely changes due to the effects of strain, its construction material has to be unfavorably changed.

Further, dislocation in a strained lattice can be prevented by reducing its layer thickness to a value less than a critical thickness, but its life time under a long-term driven condition decreases as the amount of strain increases. Moreover, the growth condition for fabricating the strained lattice becomes severe as the amount of strain increases. Therefore, it is not advantageous to increase the amount of strain excessively.

SUMMARY OF THE INVENTION

The object of the present invention is to provide, in view of the above problems, a polarization insensitive semiconductor optical amplifier or amplifying apparatus in which a change in a wavelength range of gain due to the effects of strain is small, and the amount of strain necessary for obtaining a desired effect does not need to be substantially increased, and an optical communication system using this optical amplifying apparatus.

In the polarization insensitive optical amplifying apparatus of this invention, which imparts gain to a light signal input thereto, to achieve the above object, there are provided a first semiconductor layer having a first lattice constant; a second semiconductor layer, having a second lattice constant, and formed on at least the first semiconductor layer, the second lattice constant of the second semiconductor layer being less than the first lattice constant of the first semiconductor layer, and the second semiconductor layer undergoing a biaxial tensile stress because of a lattice mismatch between the first semiconductor layer and the second semiconductor layer and serving as a well layer for an active layer having a quantum well structure; and a third semiconductor layer, having a third lattice constant, and formed on at least the first semiconductor layer, the third lattice constant of the third semiconductor layer being less than the first lattice constant of the first semiconductor layer, and the third semiconductor layer undergoing a biaxial tensile stress because of a lattice mismatch between the first semiconductor layer and the third semiconductor layer and serving as a barrier layer of the active layer having a quantum well structure. This apparatus performs polarization insensitive type optical amplifying for imparting a gain to input light from outside.

In the optical communication system of this invention, to achieve the above object, there are provided a transmitter station for transmitting optical signals; a receiver station for receiving the optical signals; a transmission line, upon which the optical signals travel, for connecting the transmitter station and the receiver station; and an optical amplifying apparatus, for amplifying the optical signals, disposed in at least one of the transmitter station and the receiver station. The optical amplifying apparatus is constructed as described above.

In the optical communication system of this invention, to achieve the above object, there are provided a transmitter station for transmitting optical signals; a receiver station for receiving the optical signals; repeater equipment for amplifying the optical signals; a transmission line, upon which the optical signals travel, for connecting the transmitter station and the receiver station through the repeater equipment; and an optical amplifying apparatus, for amplifying the optical signals, disposed in at least one of the transmitter station, the receiver station and the repeater equipment. The optical amplifying apparatus is constructed as discussed above.

In the bidirectional optical communication system of this invention to achieve the above object, there are provided a plurality of transceiver stations for transmitting and receiving optical signals; a transmission line, upon which the optical signals travel, for connecting the transceiver stations; and an optical amplifying apparatus disposed in at least one location of the transceiver stations. The optical amplifying apparatus, for amplifying the optical signals, is disposed in at least one of the transceiver stations. The amplifying apparatus is constructed as discussed above.

In the bidirectional optical communication system of this invention, to achieve the above object, there are provided a plurality of transceiver stations for transmitting and receiving optical signals; repeater equipment for amplifying optical signals; a transmission line, upon which the optical signals travel, for connecting the transceiver stations through the repeater equipment; and an optical amplifying apparatus, for amplifying the optical signals, disposed in at least one of the transceiver stations and the repeater equipment. The optical amplifying apparatus is constructed as discussed above.

In the bus-type optical communication system of this invention, to achieve the above object, there are provided a plurality of terminals which transmit and receive electrical signals; a plurality of transceiver stations, which are respectively connected to the terminals for transmitting and receiving the electrical signals to and from their respective one of the plurality of terminals, for performing optical communication among the terminals; at least one transmission line for connecting the plurality of transceiver stations; and an optical amplifying apparatus disposed in at least one of a light transmitting path from a light transmitter portion of any one of the plurality of transceiver stations to a light receiver portion of any one of the plurality of transceiver stations. The optical amplifying apparatus is constructed as discussed above.

In the active bus-type optical communication system of this invention to achieve the above object, there are provided a plurality of terminals which transmit and receive electrical signals; a plurality of optical nodes, each of the optical nodes including, at least, a plurality of means for transmitting a light signal, a plurality of means for receiving the light signal and means for controlling communication, wherein the plurality of optical nodes transmit and receive the electrical signals to and from their respective one of the plurality of terminals; a transmission line for connecting the plurality of optical nodes; and an optical amplifying apparatus, for amplifying the light signal, disposed in at least one of light transmitting path from the light signal transmitting means in any one of the plurality of optical nodes to the light signal receiving means in any one of the plurality of optical nodes. The optical amplifying apparatus is constructed as described above.

In the star-type optical communication network of this invention to achieve the above object, there are provided a plurality of transceiver stations, each of the transceiver stations including a light transmitter portion for transmitting optical signals and a light receiver portion for receiving optical signals; a star coupler which connects the optical signal between the plurality of transceiver stations; a transmission line, upon which the optical signals travel, for connecting the star coupler to the plurality of transceiver stations; and an optical amplifying apparatus, for amplifying the optical signals, disposed in at least one location on a light transmitting path within the plurality of transceiver stations and along the transmission line. The optical amplifying apparatus is constructed as discussed above.

In the loop-type optical communication system of this invention, to achieve the above object, there are provided a plurality of stations, each one of the stations including a light transmitter portion and a light receiver portion; a transmission line for connecting the stations; and an optical amplifying apparatus disposed in at least one of a light transmitting path within the plurality of stations and along the transmission line. The optical amplifying apparatus is constructed as discussed above.

In the polarization insensitive optical amplifying apparatus of the present invention, both well and barrier layers are respectively given biaxial tensile stresses and are strained, so that the amount of shifted peak wavelength with respect to the amount of shift in strain can be set to values between those of the first and second prior art methods. Thus, advantages of the first and second prior art methods can be utilized while the disadvantages thereof can be compensated for.

These advantages and others will be more readily understood in connection with the following detailed description of the preferred embodiments in conjunction with the drawings.

DESCRIPTION OF THE PREFERRED EMBODIMENT

First Embodiment

Figure 1:
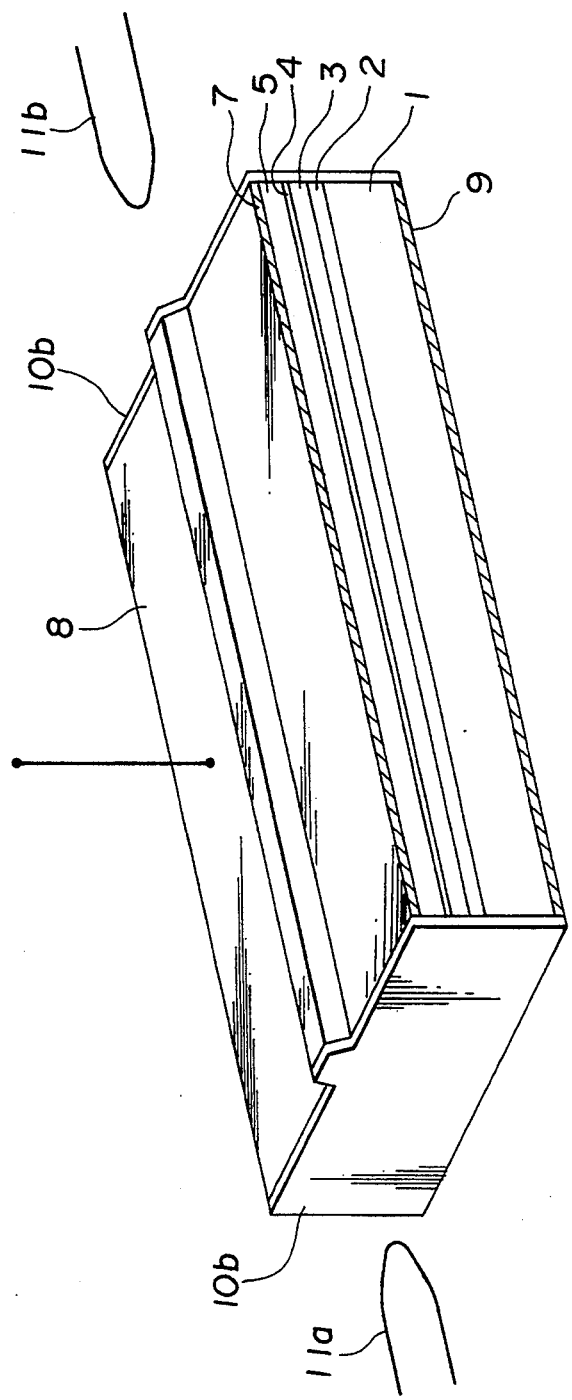
FIG. 1 is a perspective view of a first embodiment of the optical amplifying apparatus of the present invention.
Figure 2:
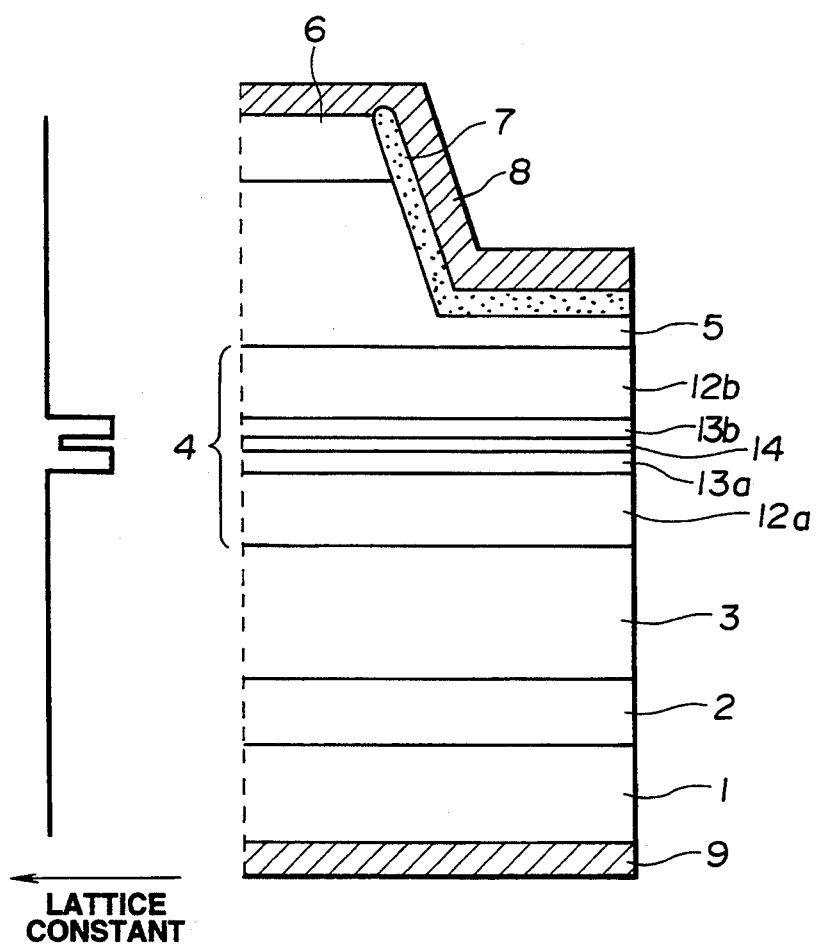
FIG. 2 is a sectional view of the first embodiment shown in FIG. 1 (a right half thereof is shown).

FIGS. 1 and 2 illustrate a first embodiment of an optical amplifying apparatus. FIG. 1 shows the entire structure of the first embodiment, and FIG. 2 is a cross-sectional view (a right-hand half of the amplifier is illustrated) showing its layer structure and the manner in which the lattice constant changes.

In the first embodiment, on a (100) substrate 1 comprising an n-type GaAs, an n-type GaAs buffer layer 2 whose thickness is 1 μm, an n-type $Al_{0.5}Ga_{0.5}As$ cladding layer 3 whose thickness is 1.5 μm, an undoped strained quantum well active layer 4, which is a graded index-separate confinement heterostructure (GRIN-SCH) layer, a p-type $Al_{0.5}Ga_{0.5}As$ cladding layer 5 whose thickness is 1.5 μm, and a p-type GaAs cap layer 6 whose thickness is 0.5 μm, are consecutively layered in this order. The layering is performed by the metal organic chemical vapor deposition (MOCVD) method.

Next, as shown in FIG. 2, the layers are etched to the p-$Al_{0.5}Ga_{0.5}As$ cladding layer 5 with a stripe-shaped region of 3 μm width being untouched. Then, after an insulating layer 7 of a silicon nitride has been deposited on the entire surface, the portion of insulating layer that is deposited on the stripe region is removed. Then, an upper electrode 8 of Au-Cr is deposited thereon and a lower electrode 9 of Au-Ge is deposited on the bottom surface of the substrate 1. Thus, a ridge type laser structure is fabricated.

Next, the wafer is cleaved at a length of 500 μm in a direction perpendicular to the direction of the stripe. Finally, antireflection coatings 10a and 10b of $ZrO_2$ are provided on both end surfaces of the apparatus by using the electron beam method. Lensed fibers 11a and 11b, whose tips are formed into a spherical shape, are disposed near the end surfaces of the device, so that signal light can be input into or output from the device.

When the arrangement is thus achieved, as shown in FIG. 1, a traveling wave-type semiconductor amplifying apparatus has been constructed and gain can be imparted to an external signal light beam between the optical fibers 11a and 11b.

The structure of the strained quantum well active layer 4 and its effect will be described. The active layer 4 comprises, viewed from the side of the substrate 1, a GRIN-$Al_xGa_{1-x}As$ layer 12a (the value x is gradually changed from 0.5 to 0.25) whose thickness is 0.2 μm, a $GaAs_{0.75}P_{0.25}$ barrier layer 13a whose thickness is 7 nm, a $GaAs_{0.9}P_{0.1}$ well layer 14 whose thickness is 6 nm, a $GaAs_{0.75}P_{0.25}$ barrier layer 13b whose thickness is 7 nm, and a GRIN-$Al_xGa_{1-x}As$ layer 12b (the value x is gradually changed from 0.25 to 0.5) whose thickness is 0.2 μm.

In this embodiment, the barrier layers 13a and 13b and the well layer 14 are respectively composed of $GaAs_{1-y}P_y$ whose lattice constant is smaller than that of the GaAs of the substrate 1, so both layers 13a and 13b and 14 are respectively undergoing biaxial tensile stresses. In the well layer 14, the value of y is equal to 0.1 and its amount of strain is −0.3%, while in the barrier layers 13a and 13b, the value of y is equal to 0.25 and their amount of strain is −0.9%.

The structure of the first embodiment will be compared to that of the prior art methods.

In order to obtain the same effect as the first embodiment, the amount of strain that the well layer must be set to is −0.5% in the first prior art method mentioned, in which strain is imparted only to the well layer. The amount of strain that the barrier layer must be set to is −1.5% in the second prior art method mentioned, in which the strain is imparted only to the barrier layer.

A peak wavelength of the gain will be compared between the first embodiment and the prior art. The peak wavelength of the first embodiment is shifted by 5 nm toward a longer wavelength, that is compared to a case where the layer thicknesses are the same as those of the first embodiment and no strain is imparted (i.e. the well layer and barrier layer respectively consist of GaAs and $Al_{0.25}Ga_{0.75}As$). When the same comparison is made, the peak wavelength of gain is shifted by 15 nm toward a longer wavelength in the first prior art method, and shifted by 3 nm toward a longer wavelength in the second prior art method.

As discussed above, in the first embodiment, the amount of shifted peak wavelength and the amount of strain can be respectively set to values between those of the first and second prior art methods. Therefore, the advantages of the first and second prior art methods can be made use of, and at the same time their disadvantages can be reduced or avoided.

In more detail, the first embodiment can attain the following technical advantages:

1) The amount of shift in the peak wavelength is small. As a result, its matching with other optical devices having similar compositions, such as semiconductor lasers, is excellent and the first embodiment is suitable for integration with optical devices.

2) The amount of strain can be set to a relatively small magnitude. As a result, the devices lifetime is long and the first embodiment is advantageous in the procurement of a long-term reliability. Further, its growth condition can be moderately set, so the first embodiment is productive.

The structure of the first embodiment is the most preferable for attaining the effects of the present invention. However, other examples of the combination of well and barrier layers for effectuating strains therein are possible. The design may be determined from a viewpoint of which effect, of the two important effects of the present invention, should be stressed. Therefore, the structure of the first embodiment should not be considered as restrictive.

Second Embodiment

Figure 3:
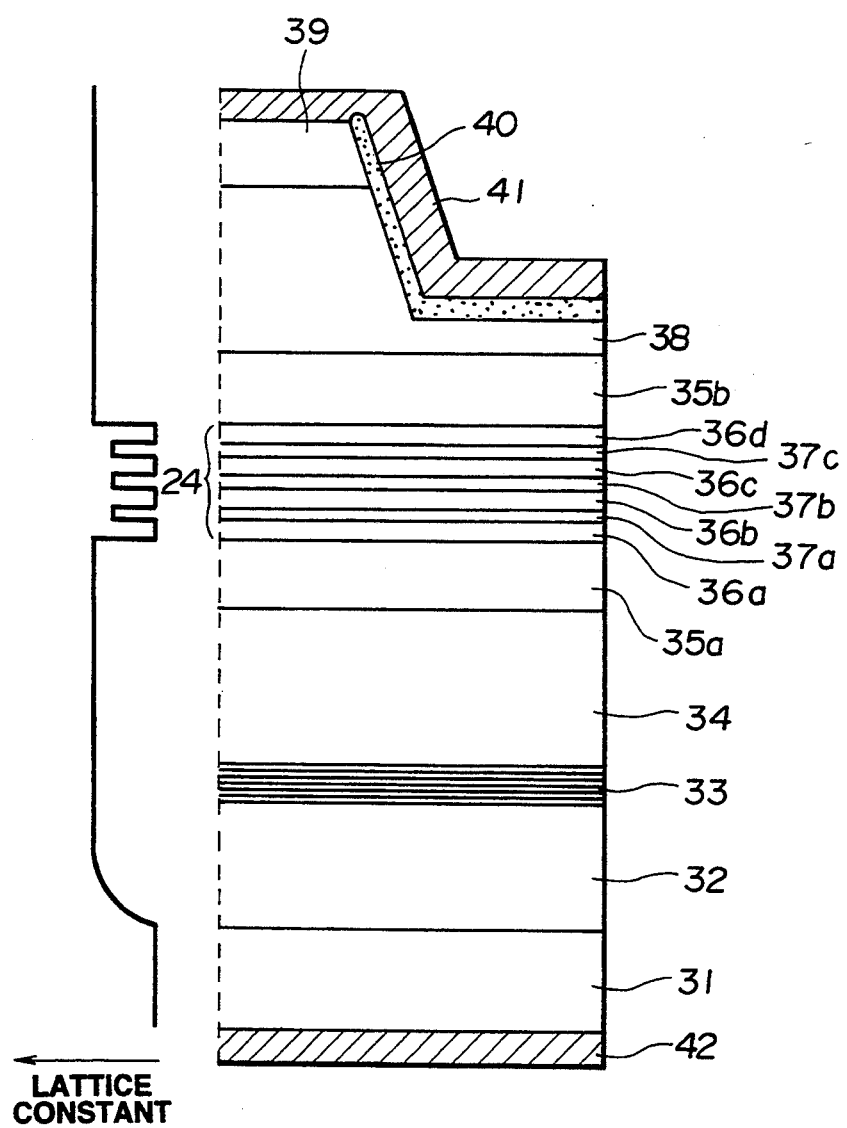
FIG. 3 is a sectional view of a second embodiment of the present invention (a right half thereof is shown).

FIG. 3 illustrates a second embodiment of an optical amplifying apparatus. The layer structure of the second embodiment is different from that of the first embodiment.

In the second embodiment, an n-type $In_xGa_{1-x}As_{1-y}P_y$ buffer layer 32, whose thickness is about 1 μm, is initially layered on a substrate 31 comprising an n-type GaAs. In the buffer layer 32, the values of x and y are respectively changed from 0 to 0.2 and from 0 to 0.1, and then the values of x and y are respectively maintained at 0.2 and 0.1 up to a thickness of approximately 2 μm. Thus, the lattice constant of the uppermost surface is about 1% larger than that of GaAs. Then, a superlattice layer 33, which is composed of ten alternately layered $In_{0.5}Ga_{0.5}As_{0.28}P_{0.72}$ layers and ten $In_{0.2}Ga_{0.8}As_{0.9}P_{0.1}$ layers (each thickness is 30 Å), is layered on the buffer layer 32. The lattice constant of the superlattice 33 is matched with that of the nearest portion of the buffer layer 32, and the superlattice 33 consists of two kinds of layers having different band gaps.

Then, an n-type $In_{0.5}Ga_{0.5}As_{0.28}P_{0.72}$ cladding layer 34 whose thickness is 1.5 μm, an $In_{0.2}Ga_{0.8}As_{0.9}P_{0.1}$ SCH layer 35a whose thickness is 0.2 μm, a 3-MQW (multi-quantum well) strained superlattice active layer 24, which consists of four alternately layered GaAs barrier layers 36a–36d (thickness: 7 nm) and three $In_{0.07}Ga_{0.93}As$ well layers 37a–37c (thickness: 6 nm), an $In_{0.2}Ga_{0.8}As_{0.9}P_{0.1}$ SCH layer 35b whose thickness is 0.2 μm, a p-type $In_{0.5}Ga_{0.5}As_{0.28}P_{0.72}$ cladding layer 38 whose thickness is 1.5 μm, and a p-type $In_{0.14}Ga_{0.86}As$ cap layer 39 whose thickness is 0.5 μm, are consecutively layered in this order.

Next, similar to the first embodiment, the layers are etched to form a ridge portion. Then, after an insulating layer 40 has been deposited on the entire surface, a portion of the insulating layer that is deposited along a stripe region is removed. Then, an upper electrode 41 is deposited thereon and a lower electrode 42 is deposited on the bottom surface of the substrate 31. Thus, a ridge type laser structure is fabricated.

Next, the wafer is cleaved to a length of 500 μm in a direction perpendicular to the direction of the stripe. Finally, antireflection coatings are provided on both end surfaces of the apparatus, and optical fibers are disposed near the end surfaces of the device.

In the second embodiment, the non-strained reference layer is a layer formed on the substrate 31, but not the substrate 31 itself. As a result, the buffer layer 32 serves as a layer for adjusting or converting the lattice constant. If the buffer layer 32 is too thin, then the layer 32 would contain strain therein. Therefore, the thickness of the buffer layer 32 needs to be larger than 1 μm. The superlattice (SL) layer 33 acts as a stopper layer so that the dislocation caused by the conversion of the lattice constant is not introduced into the upper layers.

Although the composition of the active layer 24 in the second embodiment is different from that of the first embodiment, the amount of strain produced is approximately the same. Therefore, the same effects as those of the first embodiment can be obtained in the second embodiment. Furthermore, a multi-quantum well structure is adopted in the second embodiment, so a gain can be obtained that is than the first embodiment in which a single quantum well is used.

As in the second embodiment, when a layer deposited on the substrate, but not the substrate itself (typically the cladding layer), is used as a reference layer, design freedom with regard to the strained quantum well, such as its material composition, can be increased and usefulness can be enhanced. In this case, however, the control of the oscillation wavelength can be readily performed, so the advantageousness over the first prior art method mentioned might be lessened in some cases.

Yet, the second embodiment is still a useful example for constructing a polarization insensitive optical amplifier, for the freedom in designing the strained quantum well is enhanced in this embodiment.

In the foregoing, a ridge type laser structure is exemplified, but any type of structure can be used in the present invention. In any case, gain may be controlled so that other polarization characteristics (polarization dependency on end-surface reflectivity and the like) caused by the laser structure can be compensated for, and the amount of strain, thicknesses of the well and barrier layers, and the like only need to be designed according to the adopted structure.

Moreover, the material of the substrate is not limited to GaAs, and other III–V group compounds, which contain InP, and II–VI group compounds may be used as the substrate or other layers.

Third Embodiment

Figure 4:
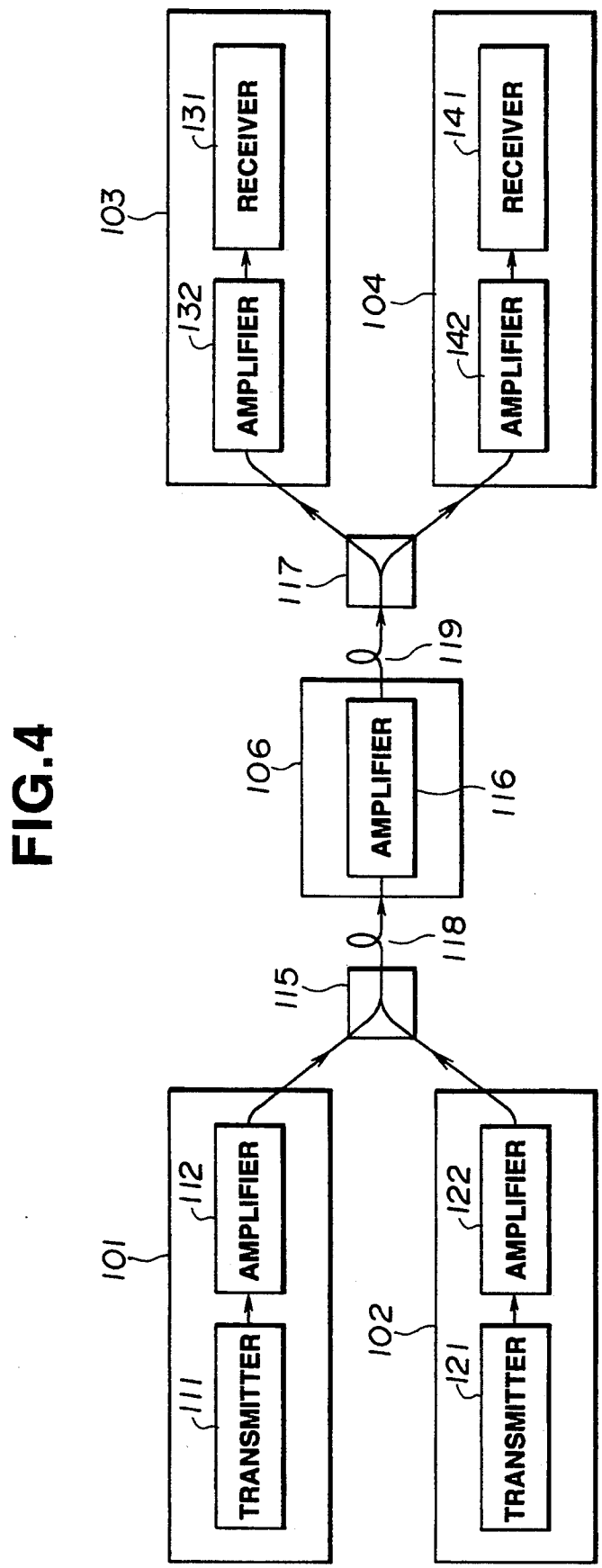
FIG. 4 is a schematic representation of an optical communication system of the present invention in which a transmitter station and a receiver station are connected by an optical transmission line.

FIG. 4 shows an optical communication system in which the above discussed optical amplifying apparatus is used. In FIG. 4, reference numerals 101 and 102 are transmitter stations, reference numerals 115 and 117 are branching-combining devices, reference numeral 106 is repeater equipment, reference numerals 103 and 104 are receiver stations, and reference numerals 118 and 119 are optical transmission lines. The transmitter stations 101 and 102, respectively, include light transmitters 111 and 121, which are provided with a signal processing portion or processor and an electro-optical converting portion or transducer, and optical amplifying devices or amplifiers 112 and 122 for amplifying a light signal output from the light transmitters 111 and 121, respectively. The repeater equipment 106 comprises an amplifier 116. The receiver stations 103 and 104, respectively, comprise optical amplifying devices or amplifiers 132 and 142 for amplifying an input signal and their respective light receivers 131 and 141 which comprise an opto-electric transducer and a signal processing portion.

In the optical communication system of FIG. 4, light signals that are output from the light transmitters 111 and 121 are amplified by the amplifying devices 112 and 121, respectively, and are output from the transmitter stations 101 and 102. The output signals do not collide with each other along the transmission line 118 because they are controlled by a prescribed multiplexing system, such as time division multiplexing, frequency division multiplexing, CSMA/CD (carrier sense multiple access/collision detection), etc. The output signals are sent to the transmission line 118 through the branching-combining device 115. When the light signal is transmitted through the transmission line 118, the light signal is attenuated. Therefore, the light signal is amplified by the repeater equipment 106. In FIG. 4, only one of the repeater equipments 106 is depicted, but if necessary, the repeater equipment 106 may be positioned at a plurality of locations. On the other hand, no repeater equipment need be used, if it is unnecessary.

The light signal amplified by the repeater equipment 106 is input into the branching-combining device 117 through the light transmission line 119 and is separated by a separation method that corresponds to the prescribed multiplexing system and is input into the receiving stations 103 and 104. The light signal input to each receiver station 103 and 104 is amplified by the optical amplifiers 132 and 142, respectively, to compensate for losses generated in both the light transmission line 119 and the branching-combining device 117, and is input into the light receivers 131 and 141, respectively. Thus, communications from the transmitter station 101 to the receiver station 103 and from the transmitter station 102 to the receiver station 104 are conducted through the single light transmission line 118 and 119.

In FIG. 4, there are two transmitter stations and two receiver stations, but the number of branches of the branching-combining devices 115 and 117 may be increased to attain an N to N communication by using N number of transmitter stations and N number of receiver stations. Further, one to one communication is also possible without using the branching-combining devices 115 and 117. In FIG. 4, there is no need to position the optical amplifying apparatus in all the illustrated locations. This apparatus has only to be positioned in a location where signal attenuation at each part should be compensated for.

When the polarization insensitive optical amplifying apparatus is used in the optical communication system, as shown in FIG. 4, the light receiver in the system will not substantially effect the dynamic range and the like because, even if the amplifying apparatus receives an unstable light signal in its state of polarization, the output therefrom is always supplied being amplified to a constant level.

Further, a preferable optical communication system is attained, and there is no limitation as to the scale of the system since there is no power fluctuation in the light signal. Since the polarization dependency is solved without any degrading characteristics other than the gain characteristic, such as noise characteristic, the system is still preferable in this point. Moreover, there is no need to use means or apparatuses specially devised in coping with the fluctuation in the state of polarization, as signal processing means, E/O and O/E converting means, optical transmission line, etc., because a polarization insensitive amplifier is used in the system. As for those means for coping with fluctuation, conventional ones can be used.

Fourth Embodiment

Figure 5:
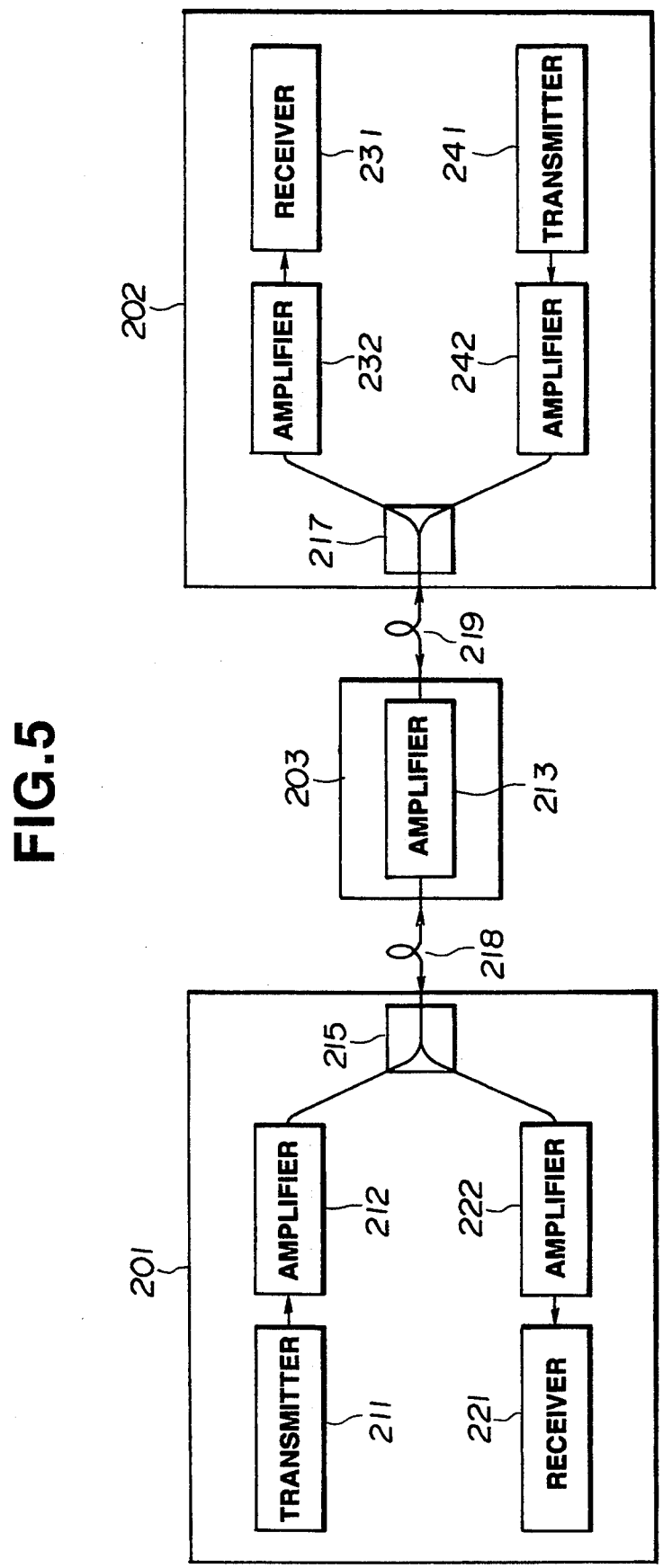
FIG. 5 is a schematic representation of a bidirectional optical communication system of the present invention in which transceiver stations are connected by an optical transmission line.

FIG. 5 shows an example of a bidirectional optical communication system in which the polarization insensitive amplifying apparatus of the present invention is employed. In the optical communication system shown in FIG. 5, reference numerals 201 and 202 are transceiving stations, reference numeral 203 is repeater equipment, and reference numerals 218 and 219 are optical transmission lines. The transceiving stations 201 and 202, respectively, include transmitters and receivers, and the transmitters are light transmitters 211 and 241, respectively, which comprise a signal processor and an E/O converting portion. The transceiving stations 201 and 202 also comprise optical amplifiers 212 and 242, respectively, for amplifying the signal output from the light transmitters 211 and 241. The transceiver stations 201 and 202 have optical amplifiers 222 and 232, respectively, for amplifying the input light signal, and light receivers 221 and 231, respectively, which include an O/E converting portion and a signal processor. In the transceiver stations 201 and 202, the transmitter and receiver are connected by branching-combining devices 215 and 217. The repeater equipment 203 includes an optical amplifier 213 and is connected to each transceiver stations 201 and 202 through the optical transmission lines 218 and 219.

In the structure of FIG. 5, light signals output from the light transmitter 211 in the transceiver station 201 and the light transmitter 241 in the transceiver station 202 are respectively amplified by the optical amplifiers 212 and 242 and are sent out from each transceiver station 201 and 202 through the branching-combining devices 215 and 217, respectively. These output light signals are respectively transmitted in opposite directions through the optical transmission lines 218 and 219. The light signals are amplified by the repeater equipment 203 since the amount of light is attenuated when the light signals are transmitted through the transmission lines 218 and 219.

In FIG. 5, the repeater equipment 203 is depicted as being in one location, but if necessary, it can be placed in a plurality of locations. If the repeater equipment 203 is not needed, it may be omitted. The light signals amplified by the repeater 203 are further transmitted through the transmission lines 219 and 218 and then input to the transceiver stations 202 and 201 at the opposite side of the light signals origin. The input signals are branched off by the branching-combining devices 217 and 215 in the directions to the light receivers 231 and 221, respectively, and are amplified by the optical amplifiers 232 and 222, respectively, in order to compensate for losses caused in both the transmission lines 218 and 219 and the branching-combining devices 215 and 217, and are input into the light receivers 231 and 221. Thus, bidirectional communication is performed between the transceiver stations 201 and 202 through single transmission lines 218 and 219.

In FIG. 5, there is illustrated the example of a bidirectional communication in which two transceiver stations are provided, each having one transmitter and one receiver. However, such structures are possible wherein each transceiver station comprises a plurality of transmitters and receivers or wherein a plurality of transceiver stations are connected by the branching-combining device. There is no need to position the optical amplifiers in all the locations illustrated in FIG. 5, and the amplifier has only to be positioned where the attenuation of the light signal need be compensated for. For the rest, the system of FIG. 5 is the same as that of FIG. 4.

Fifth Embodiment

Figure 6:
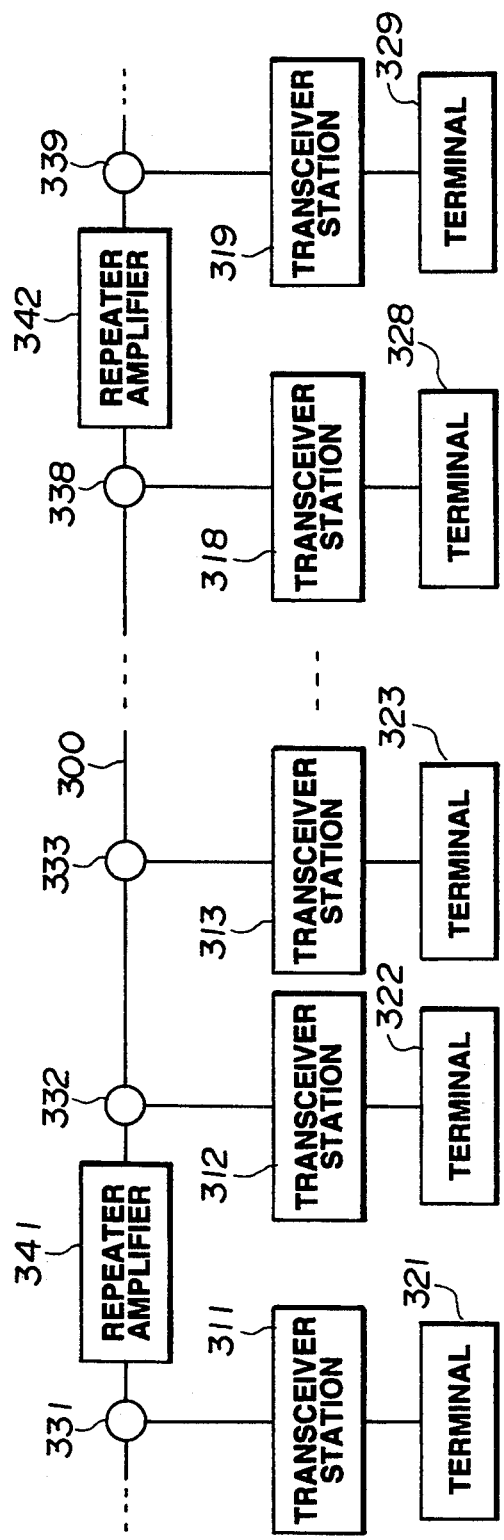
FIG. 6 is a schematic representation of a bus-type optical communication network of the present invention in which a plurality of terminals conduct optical communication amongst themselves through an optical transmission line using transceiver stations.
Figure 7:
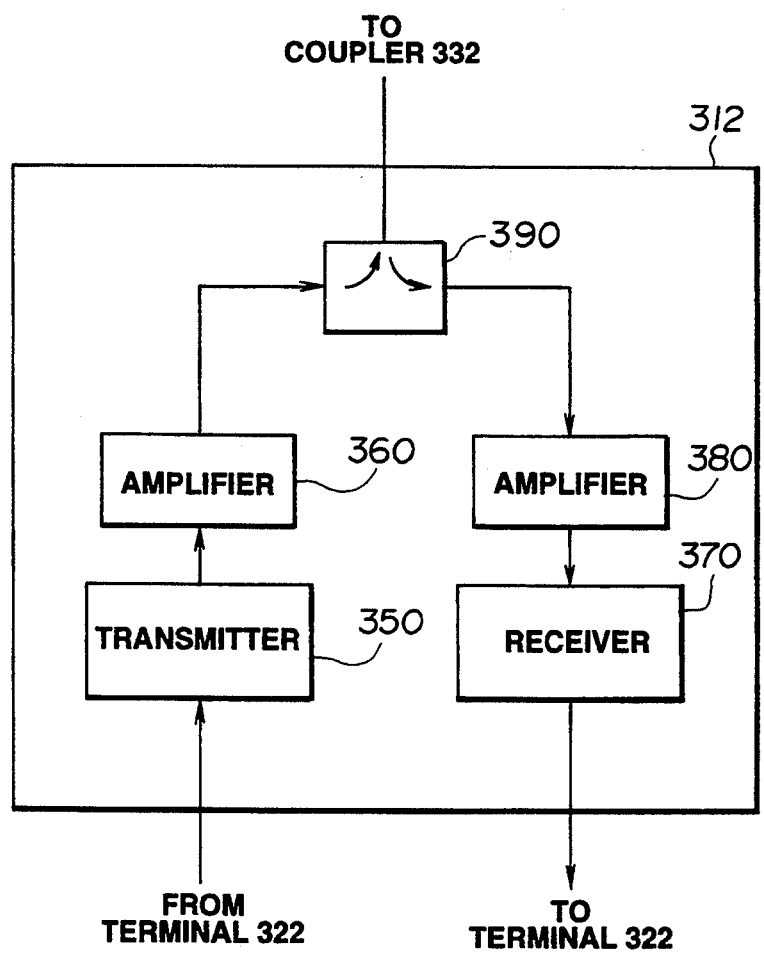
FIG. 7 is a schematic representation of the transceiver stations in the embodiment of FIG. 6.

FIGS. 6 and 7 show a bus-type optical communication network in which a polarization insensitive type optical amplifying apparatus of the present invention is used.

In FIG. 6, showing the overall system, reference numeral 300 is an optical transmission line comprising optical fibers, reference numerals 311–319 are respectively transceiver stations or units, which convert electric signals from terminals 321–329 to light signals to send them out to the transmission line 300, or convert the light signal on the transmission line to an electric signal to transfer it to the terminal. The transceiver stations or units 311–319 detect the condition of communication on the optical transmission line 300 and control the communication in such a manner that signals from other terminals will not collide with the signal from its own terminal. Further, reference numerals 331–339 are, respectively, optical couplers which are connected to the transmission line 300, and take out part of the signal on the optical transmission line 300 to transmit it to the transceiver stations 311–319 and to send out the light signals from the transceiver stations 311–319 to the transmission line 300. Reference numerals 341 and 342 are, respectively, repeater optical amplifiers for amplifying the light signal on the transmission line 300. The polarization insensitive optical amplifying apparatus is used as those repeater optical amplifiers 341 and 342.

FIG. 7 illustrates one example of the structure of the transceiver station 312 in FIG. 6. In FIG. 7, reference numeral 350 is a light transmitter, which converts the electrical signal from the terminal 322 to an optical signal and transmits this light signal to the transmission line by controlling it in such a manner that the signals from the other terminals will not collide with that light signal when on the optical transmission line 300. Reference numeral 360 is an optical amplifier for amplifying the light signal from the light transmitter 350, reference numeral 370 is a light receiver which converts the light signal transmitted through the transmission line 300 to an electric signal and transmits this electric signal to its own terminal if the signal is addressed to that terminal (in this case, terminal 322) which is connected to its own transceiver station 312, reference numeral 380 is an optical amplifier for amplifying the signal transmitted through the transmission line 300 to the light receiver 370, and reference numeral 390 is a branching-combining device for sending out the optical signal from the amplifier 360 to the coupler (in this case, coupler 332) and transmitting the optical signal from the optical coupler 332 to the amplifier 380. The polarization insensitive type optical amplifying apparatus of the present invention is utilized as optical amplifiers 360 and 380. Here, only the structure of the transceiver station 312 is explained, but the transceiver stations 311–319 also have similar structures.

The operation of this embodiment will be explained, assuming that the communication is performed between the terminals 322 and 329. When the signal is to be transmitted from the terminal 322, first the light transmitter 350 controls the light signal from the terminal 322 such that it will not collide with the light signals from the other terminals on the optical transmission line 300. Such control is provided by using a prescribed multiplexing system such as time division multiplexing, frequency division multiplexing and CSMA/CD. The light transmitter 350 converts the electrical signal from the terminal 322 to an optical signal to transmit it to the optical amplifier 360. This signal is amplified by the optical amplifier 360 to be sent out on the optical transmission line 300 in opposite directions by the optical coupler 332 through the branching-combining device 390. This optical signal reaches the repeater optical amplifier 342 through the couplers 333, ..., 338. At this time, part of this optical signal's power has been branched by each optical coupler and has been transmitted to the transceiver stations 313, ..., 318, and these transceiver stations recognize that this signal is not addressed to their own terminals 323, ..., 328, respectively, and abandon this optical signal. The optical signal that arrives at the repeater optical amplifier 342 has been lowered in its signal intensity since part thereof has been branched at each optical coupler, but its intensity is regained by the amplification at the repeater optical amplifier 342 and thus the regained signal is transmitted to the optical coupler 339 through the transmission line 300.

At the optical coupler 339, part of the optical signal is branched so as to be transmitted to the transceiver station 319, and the signal is sent to the light receiver through devices similar to the branching-combining device 390 shown in FIG. 7. In this light receiver, the transmitted optical signal is converted to an electric signal, and the light receiver recognizes that this signal is addressed to the terminal 329 and transmits it to the terminal 329.

When the signal is transmitted from the terminal 329 to the terminal 322, the signal is transmitted on the transmission line 300 in opposite directions based on a process similar to that mentioned above. Here, the optical signal that reaches the transceiver station 312 passes through the optical couplers 338, ..., 333, 332 and thereafter through the optical branching-combining device 390, so that the signal is attenuated at each part and its intensity has been weakened. However, the signal is amplified by the optical amplifier 380 before reaching the light receiver 370, and is transmitted to the light receiver 370 after its intensity has been regained.

Thus, the amplifier 360 amplifies the light signal from the light transmitter 350 and transmits it to the transmission line 300, and the optical amplifiers 341, 342 and 380 compensate for the attenuation of light power that is caused along the path of light signal, including the optical node to amplify the optical signal, in such a manner that the optical signal has enough power to be received. Several advantages are achieved, which are similar to those found in the systems shown in FIGS. 4 and 5.

In this embodiment, the optical amplifiers are positioned right after the light transmitter 350, just before the light receiver 370, and on the optical transmission line 300. However, if the light transmitter 350 can transmit an optical signal having sufficient power, the optical amplifier 360 is unnecessary. Further, if the output from the branching-combining device 390 has enough power to be received by the light receiver 370, the amplifier 380 is also dispensable. Further, if the number of optical couplers on the transmission line 300 is small, and the attenuation at the optical couplers is not critical, the optical amplifiers 341 and 342, on the transmission line 300, can also be omitted. Thus, all the amplifiers shown in FIGS. 6 and 7 are not necessary. When at least one of them is used, the bus-type optical communication network can achieve the above-mentioned advantages.

In the system of FIG. 6, the repeater optical amplifiers 341 and 342 are positioned on the optical transmission line 300 separately from the optical couplers 331, . . . , 339. But also, when a repeater optical amplifier is contained in each optical coupler, the above-mentioned advantages can be attained only if the optical amplifying apparatus of the present invention is used in the system.

In this embodiment, only a single transmission line 300 is used, but the above advantages can also be attained when a bidirectional communication or a multiplexing communication is performed using, for example, a plurality of optical fibers as optical transmission lines.

Sixth Embodiment

Figure 8:
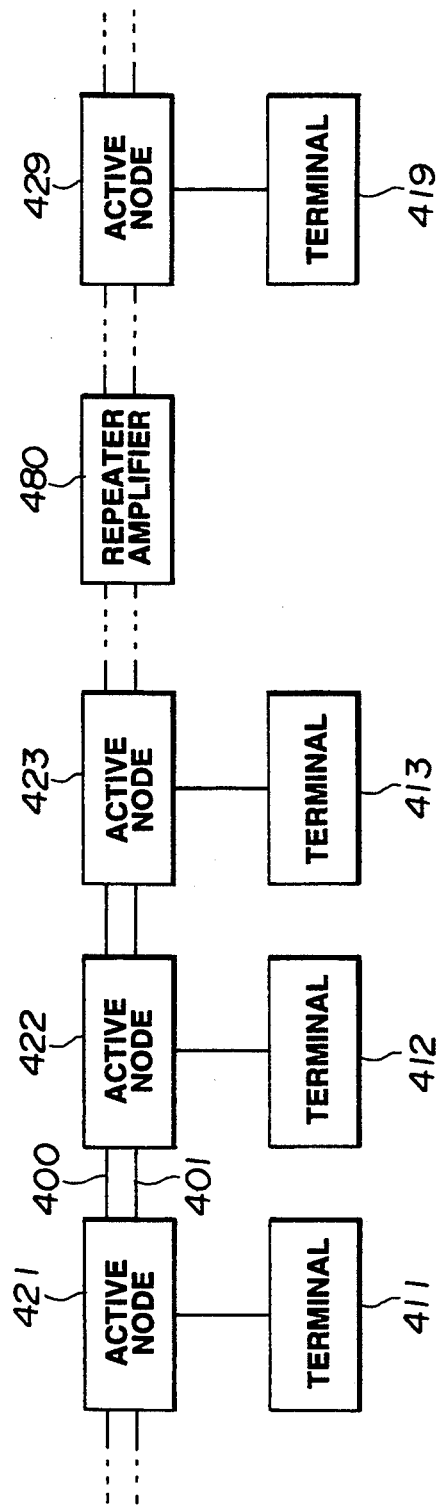
FIG. 8 is a schematic representation of a bus-type optical communication network of the present invention in which a plurality of terminals conduct optical communication amongst themselves through an optical transmission line using an active optical node.
Figure 9:
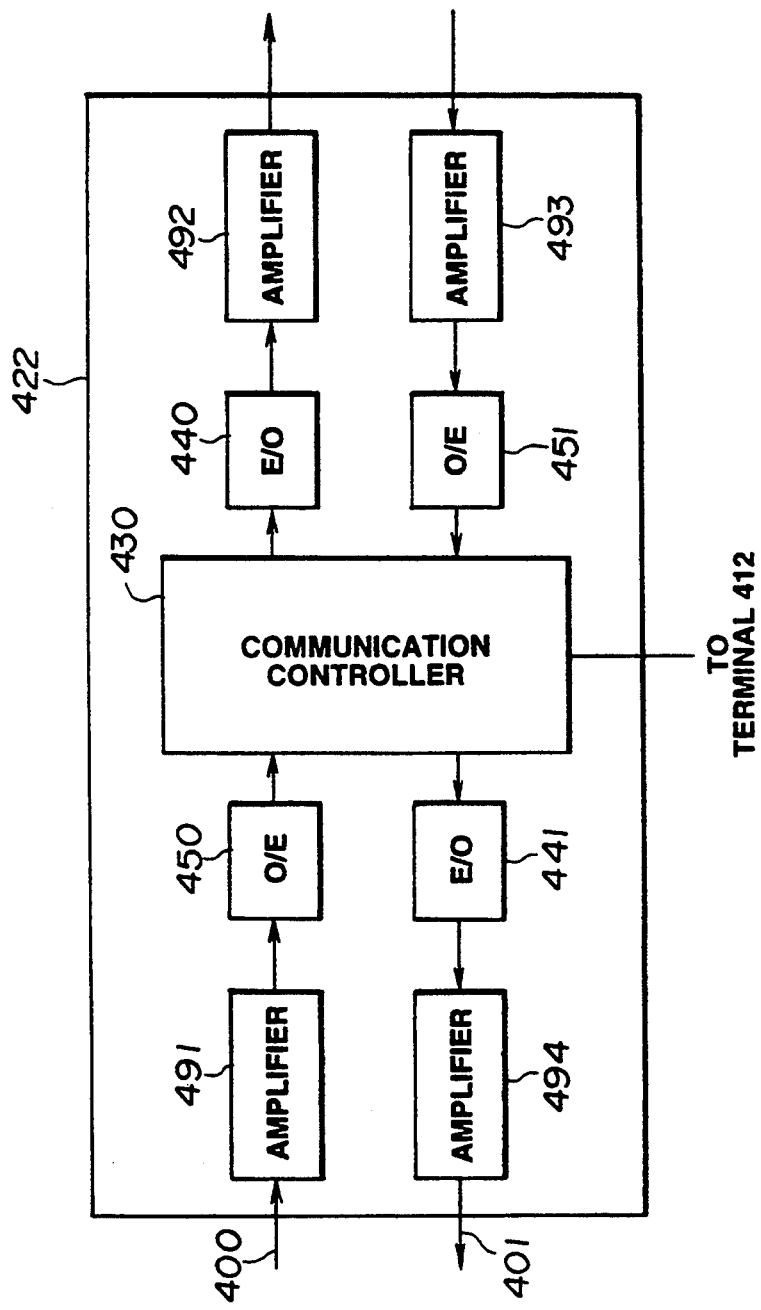
FIG. 9 is a block diagram of the active optical node in FIG. 8.

FIGS. 8 and 9 show an example of an active bus-type optical communication network in which the polarization insensitive optical amplifying apparatus is used. In FIG. 8, illustrating the overall structure of the system, reference numerals 400 and 401 are optical transmission lines such as optical fibers, reference numerals 411, . . . , 419 are terminals for performing communication, reference numerals 421, . . . , 429 are active optical nodes for conducting light transmission, light receiving and communication control, and reference numeral 480 is a repeater optical amplifier for amplifying the optical signal. In FIG. 9, which shows, as an example, the structure of one active optical node 422, and reference numerals 450 and 451 are opto-electric converter (O/E) for converting an optical signal to an electric signal. Reference numerals 440 and 441 are electro-optical converters (E/O) for converting an electric signal to an optical signal, and reference numeral 430 is a communication controller. The controller 430 determines if the signal transmitted through the transmission lines 400 and 401, and converted to an electric signal, is addressed to the terminal 412, and if so, the controller 430 transmits the signal to the terminal 412 and if not so, the controller 430 again converts the signal to an optical signal using the E/O devices 440 and 441 to transmit this signal to the optical transmission lines 400 and 401. Further, when the signal is transmitted to the controller 430 from the terminal 412, the controller 430 converts the electrical signal to an optical signal using the E/O devices 440 and 441 and transmits it to the transmission lines 400 and 401, respectively, under such control that the signal will not collide with the optical signals from the other terminals. The reference numerals 491–494 are optical amplifiers of the polarization insensitive type.

The operation of this embodiment will be explained, taking a case in which the signal is transmitted from the terminal 412 to the terminal 419, as an example. When the signal is output from the terminal 412, the communication controller 430, in the active optical node, converts the electrical signal from the terminal 412 to an optical signal with the E/O devices 440 and 441. Then, the optical amplifiers 492 and 494 amplify the signal and it is transmitted on the optical transmission lines 400 and 401 in opposite directions along the lines. The signal from the terminal 412 will not collide with the signals from the other terminals on the transmission lines 400 and 401 because they are controlled using a prescribed multiplexing system such as time division multiplexing, frequency division multiplexing and CSMA/CD. This signal enters the active optical nodes 421 and 423, and is converted to an electric signal to be input into the communication controller in the active optical nodes 421 and 423. However, this signal is not addressed to the terminal 411 and 413, therefore, the signal is once again converted to an optical signal to be sent out to the optical transmission line.

The distance between the terminals 423 and 429 is long. Therefore, the optical signal loses its intensity while traveling along the optical fiber. To amplify this signal and compensate for the loss, a repeater optical amplifier 480 is inserted in the transmission lines 400 and 401. The optical signal, amplified by the repeater optical amplifier 480, is further amplified by the optical amplifier in the active optical node 429 and is then converted to an electric signal to reach the communication controller. The communication controller in the active optical node 429 recognizes that this signal is addressed to the terminal 419, and transmits it to the terminal 419. On the other hand, the signal sent out to the active optical node 421 from the node 422 through the transmission line 401 consecutively passes the active optical nodes and reaches the left end of the communication system. There, the signal is abandoned.

Thus, the optical transmission line 400 shares the signal transmission in the right direction in FIG. 8, and the line 401 shares that in the left direction. Therefore, signals output from any terminal are simultaneously transmitted in opposite directions, so they reach the addressed terminals without failure.

In the above manner, the optical amplifiers 492 and 494 amplify the signals from the E/O devices 440 and 441, respectively, so as to transmit them on the transmission lines 400 and 401 respectively. The amplifiers 491 and 493 amplify the optical signals so that the attenuation of light power in the transmission line is compensated for and the optical signals have enough power to be received. Further, the repeater amplifier 480 compensates for light losses where the distance between the active optical nodes is long. The polarization insensitive amplifying apparatus of the present invention is used as the above optical amplifiers.

In the system of this embodiment, several advantages can be attained, which are similar to those of the systems shown in FIGS. 6 and 7.

In this embodiment, the optical amplifiers are disposed in several locations, as shown in FIGS. 8 and 9, but, for example, if the E/O devices 440 and 441 can output an optical signal having adequate power, there is no need to use the amplifiers 492 and 494. If the active node receives enough power so that the O/E devices 450 and 451 can receive it, the optical amplifiers 491 and 493 can be omitted. Further, if the distance between the terminals is not so long as to make the losses in optical fibers considerable, the repeater optical amplifier 480 is dispensable. However, only if at least one amplifier is used, can the active bus-type optical communication network obtain the above-mentioned advantages.

In the system of FIG. 8, there are two transmission lines between the active optical nodes to perform bidirectional communication. But also, in cases where bidirectional signal communication is performed with a single optical transmission line using the optical branching-combining device, as shown in FIG. 5, and where multiplexing signal communication is conducted using at least three transmission lines, the above mentioned advantages can be obtained if the polarization insensitive optical amplifying apparatus of the present invention, is used in each optical transmission line.

Seventh Embodiment

Figure 10:
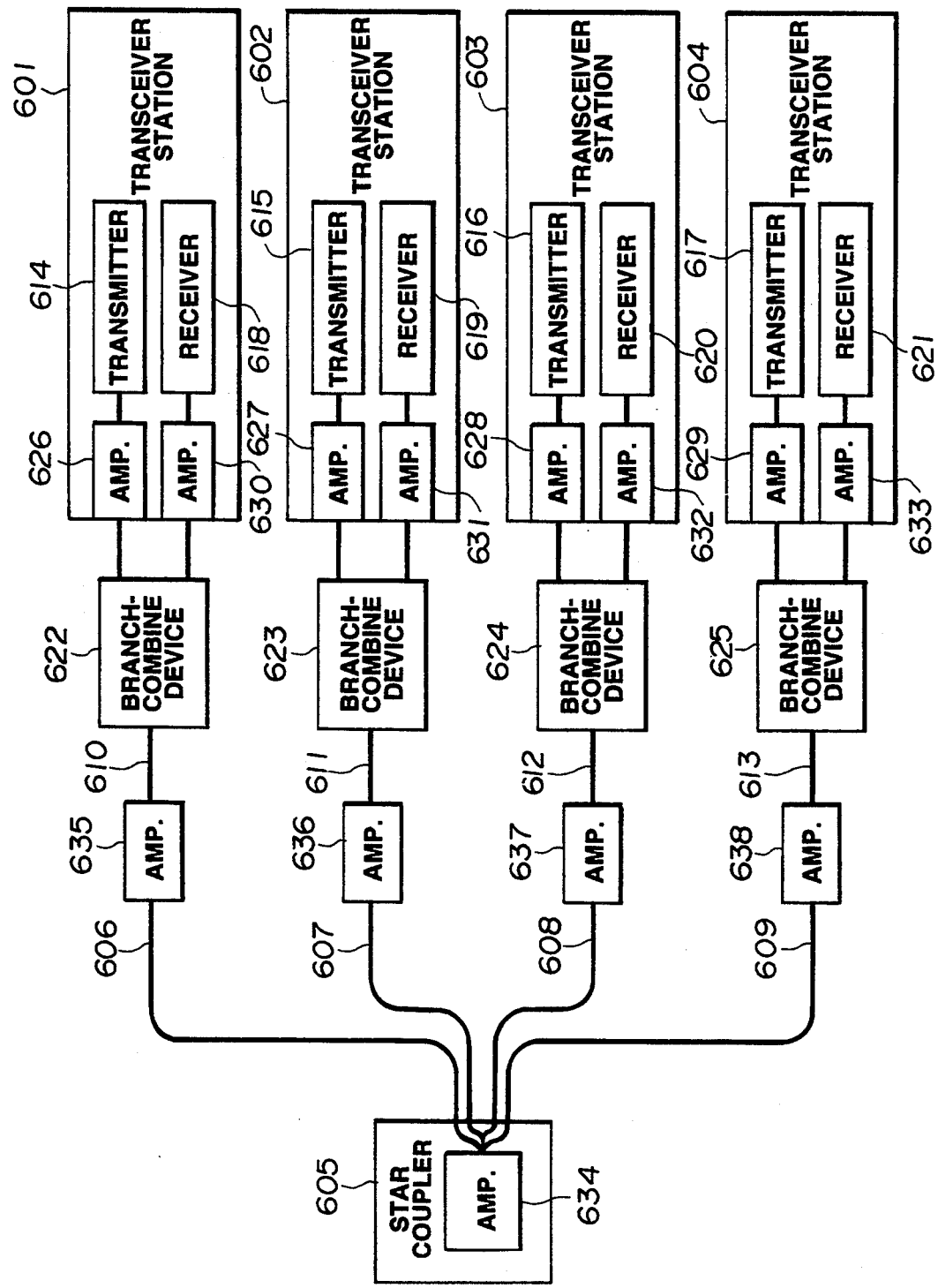
FIG. 10 is a schematic representation of a star-type optical communication network of the present invention.

FIG. 10 shows the structure of a star-type optical communication network in which a polarization insensitive amplifying apparatus is used. In this embodiment, there are four transceiver stations, and the optical signals are transmitted in each optical fiber in opposite directions.

In FIG. 10, reference numerals 601–604 are transceiver stations which connect terminals to the network, and reference numeral 605 is a star coupler, which connects inputs and outputs of the transceiver stations 601–604 in the network in a matrix form. Reference numerals 606–613 are transmission lines which are optical fibers, reference numerals 614–617 are light transmitters which convert electric signals to optical signals to transmit them to the network, and reference numerals 618–621 are light receivers which convert optical signals incident from the network to electric signals. Reference numerals 622–625 are optical branching-combining devices which connect the transmitters 614–617 and receivers 618–621 in the transceiver stations to the optical fibers 610–613, respectively, and reference numerals 626–638 are the above optical amplifying apparatuses or amplifiers of the present invention which directly amplify the optical signals. These amplifying apparatuses 626–638 are classified into booster amplifiers 626–629 for the light transmitters 614–617, respectively, pre-amplifiers 630–633 for the light receivers 618–621, respectively, a booster amplifier 634 of the star coupler 605, and repeater amplifiers 635–638 of the transmission line.

Next, the operation of this embodiment will be explained, assuming that communication is performed from the transceiver station 601 to the transceiver station 603. An electric signal is converted into an optical signal in the transmitter 614 of the transceiver station 601, and this light signal is amplified by the optical amplifier 626 and transmitted to the optical fiber 610 of the network through the branching-combining device 622. The optical signal incident on the optical fiber 610 is amplified by the optical amplifier 635 and is transmitted to the star coupler 605 through the optical fiber 606. The optical signal is amplified by the optical amplifier 634 in the star coupler 605, and is sent out to the optical fibers 606–609, which are connected to the star coupler 605. The optical signals incident on the optical fibers 606–609 are amplified by the optical amplifiers 635–638, are branched by the branching-combining devices 622–625, and parts thereof are amplified by the optical amplifiers 630–633 to be transmitted to the receivers 618–621, respectively.

The receivers 618–621 convert the optical signals to electric signals. The transceiver stations 601–604 then respectively discriminate whether the signal is addressed to itself from those converted electric signals. This signal is addressed to the transceiver station 603, so that the transceiver station 603 identifies this signal and receives it. Thus, the communication is completed. Also in the star-type system, in order to transmit optical signals from any transceiver station to all the transmission lines, the communication is conducted in such a manner that the optical signals will not collide with one another on the transmission line by using time division multiplexing, frequency division multiplexing, etc.

In this embodiment, the optical amplifying apparatuses of the present invention are positioned in all paths along which the optical signals are transmitted in the network, but it is possible to position the optical amplifying apparatus in only part of those paths. Further, in this embodiment, the transmitter and receiver are connected by the branching-combining device and bidirectional communication is performed using one optical fiber for one transceiver station. But, such a system is possible when two optical fibers, one for transmitting and one for receiving, are used for one transceiver station.

Also in this embodiment, there are the above-mentioned technical advantages that are similar to those of the networks shown in FIGS. 6 and 8, since the optical amplifying apparatus of the present invention is used.

Eighth Embodiment

Figure 11:
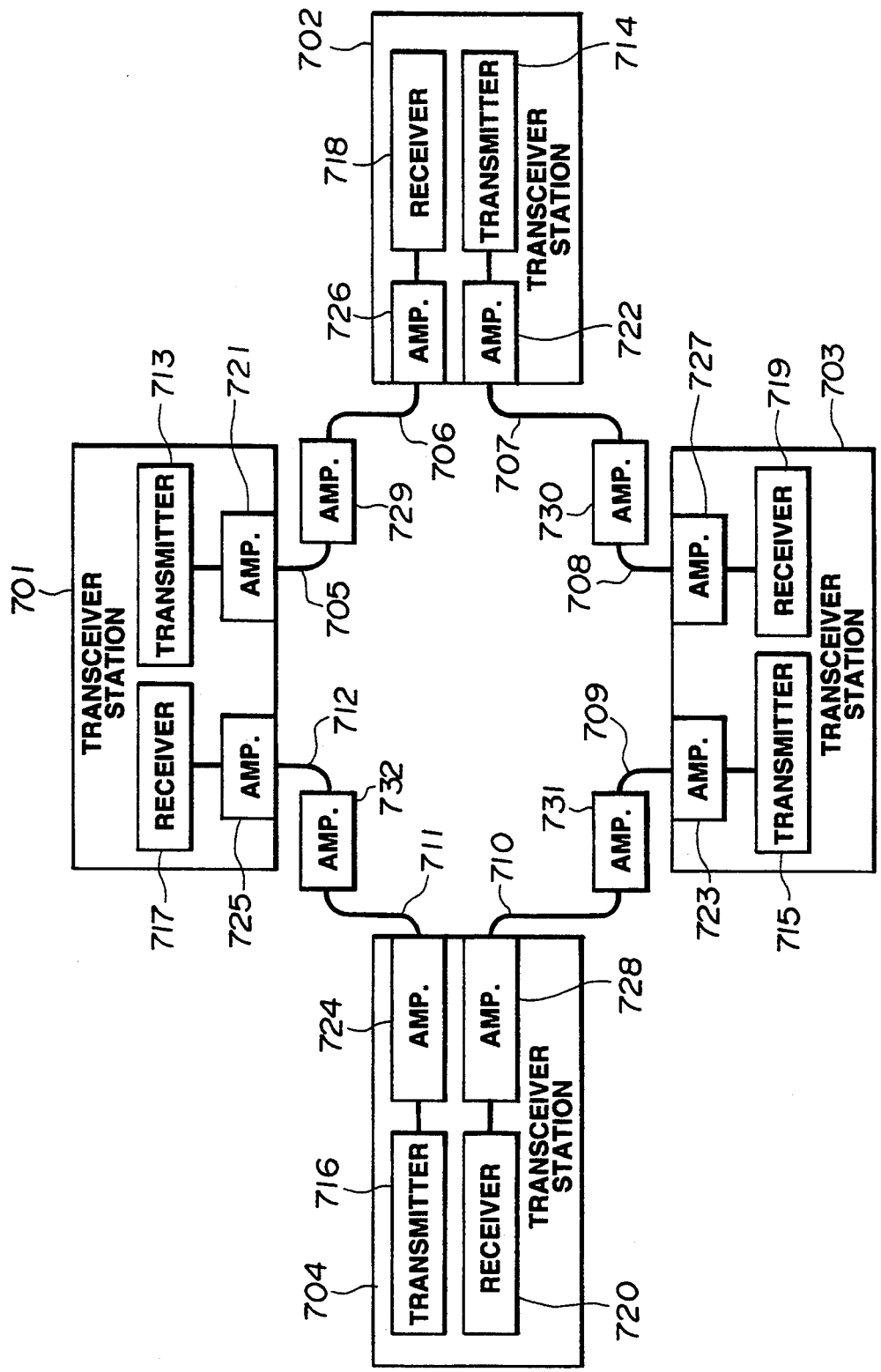
FIG. 11 is a schematic representation of a loop-type optical communication network of the present invention.

FIG. 11 shows the structure of a loop-type optical communication network in which a polarization insensitive type optical amplifying apparatus of the present invention is used. In this embodiment, there are four transceiver stations and an optical signal is transmitted in a clockwise direction in the loop network. In FIG. 11, reference numerals 701–704 are transceiver stations for connecting terminals to the network, reference numerals 705–712 are optical fibers, reference numerals 713–716 are transmitters for converting an electric signal to an optical signal so as to transmit it to the network, reference numerals 717–720 are receivers for converting the optical signal input from the network to the electric signal, and reference numerals 721–732 are optical amplifiers of the present invention for directly amplifying the optical signal. The optical amplifiers 721–732 are classified as booster amplifiers 721–724 for the transmitters 713–716, respectively, pre-amplifiers 725–728 for the receivers 717–720, respectively, and repeater amplifiers 729–732 located along the optical transmission line.

Next, the operation of this embodiment will be explained, assuming that the communication is conducted from the transceiver station 701 to the transceiver station 703. An electric signal is converted to an optical signal in the transmitter 713 of the transceiver station 701, and is amplified by the optical amplifier 721 to be transmitted to the optical fiber 705 in the network. This optical signal is amplified by the optical amplifier 729, transmitted through the optical fiber 706, amplified by the optical amplifier 726 in the transceiver station 702 and converted to an electric signal in the receiver 718. Since this signal is addressed to the transceiver station 703, the signal is converted to an optical signal in the transmitter 714 of the transceiver station 702 and this light signal is amplified by the optical amplifier 722 to be input into the optical fiber 707 in the network. This optical signal is amplified by the optical amplifier 730, transmitted through the optical fiber 708, amplified by the optical amplifier 727 of the transceiver station 703, and converted to an electric signal in the receiver 719. Since this signal is addressed to the transceiver station 703, the transceiver station 703 identifies this signal and receives it. Thus, communication is completed.

In this embodiment, there are optical amplifiers positioned in all the paths in the network along which light signals are transmitted, but it is possible to position the optical amplifier in only part of the paths in the network. Further, this embodiment is an active type in which the signal in the transceiver station is regenerated and repeated. But, it is possible to construct a passive-type system in which the optical branching-combining device is used to connect the transceiver station to the optical fiber which is the transmission line.

Also in this embodiment, since the optical amplifying apparatus of the present invention is used, the above discussed advantages of the networks shown in FIGS. 6 and 8 can be similarly obtained.

As described in the foregoing, according to the present invention, a so-called polarization insensitive optical amplifying apparatus, in which its amplification gain would not vary even if the polarization state of an input light changes, can be attained. By using such a polarization insensitive optical amplifying apparatus, an optical communication network or system, in which communication quality is excellent, and in which there is no limit to its size, and in which its system structure is relatively simple, can be realized.

Except as otherwise disclosed herein, the various components shown in outline or in block form in the Figures are individually well known in the field of optical amplifying apparatuses or amplifiers and the optical communication systems arts, and their internal construction and operation are not critical either to the making or using of this invention or to a description of the best mode of the invention.

While the present invention has been described with respect to what is presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A polarization insensitive optical amplifying apparatus for imparting a gain to a light signal input thereto, said apparatus comprising:
   a first semiconductor layer having a first lattice constant;
   a second semiconductor layer, having a second lattice constant, and formed on at least said first semiconductor layer, the second lattice constant of said second semiconductor layer being less than the first lattice constant of said first semiconductor layer, and said second semiconductor layer undergoing a biaxial tensile stress because of a lattice mismatch between said first semiconductor layer and said second semiconductor layer, and serving as a well layer for an active layer having a quantum well structure; and
   a third semiconductor layer, having a third lattice constant, and formed on at least said first semiconductor layer, the third lattice constant of said third semiconductor layer being less than the first lattice constant of said first semiconductor layer, and said third semiconductor layer undergoing a biaxial tensile stress because of a lattice mismatch between said first semiconductor layer and said third semiconductor layer, and serving as a barrier layer of the active layer having the quantum well structure.

2. A polarization insensitive optical amplifying apparatus according to claim 1, wherein said first semiconductor layer comprises a substrate.

3. A polarization insensitive optical amplifying apparatus according to claim 1, wherein said first semiconductor layer comprises a semiconductor layer formed on at least a substrate.

4. A polarization insensitive optical amplifying apparatus according to claim 3, wherein said first semiconductor layer comprises an InGaAsP layer, said second semiconductor layer comprises an InGaAs layer, said third semiconductor layer comprises a GaAs layer, and said substrate comprises a GaAs substrate.

5. A polarization insensitive optical amplifying apparatus according to claim 1, wherein said first semiconductor layer comprises an AlGaAs layer, said second semiconductor layer comprises a GaAsP layer, and said third semiconductor layer comprises a GaAsP layer.

6. A polarization insensitive optical amplifying apparatus according to claim 1, wherein the lattice mismatches of the second lattice constant of said second semiconductor layer and the third lattice constant of said third semiconductor layer both relative to the first lattice constant of said first semiconductor layer are respectively less than 1%.

7. An optical communication system comprising:
   a transmitter station for transmitting optical signals;
   a receiver station for receiving the optical signals;
   a transmission line, upon which the optical signals travel, for connecting said transmitter station and said receiver station; and
   an optical amplifying apparatus, for amplifying the optical signals, disposed in at least one of said transmitter station and said receiver station, said optical amplifying apparatus comprising:
      a first semiconductor layer having a first lattice constant;
      a second semiconductor layer, having a second lattice constant, and formed on at least said first semiconductor layer, the second lattice constant of said second semiconductor layer being less than the first lattice constant of said first semiconductor layer, and said second semiconductor layer undergoing a biaxial tensile stress because of a lattice mismatch between said first semiconductor layer and said second semiconductor layer, and serving as a well layer for an active layer having a quantum well structure; and
      a third semiconductor layer, having a third lattice constant, and formed on said first semiconductor layer, the third lattice constant of said third semiconductor layer being less than the first lattice constant of said first semiconductor layer, and said third semiconductor layer undergoing a biaxial tensile stress because of a lattice mismatch between said first semiconductor layer and said third semiconductor layer, and serving as a barrier layer for the active layer having the quantum well structure.

8. An optical communication system comprising:
   a transmitter station for transmitting optical signals;
   a receiver station for receiving the optical signals;
   a repeater equipment for amplifying the optical signals;

a transmission line, upon which the optical signals travel, for connecting said transmitter station and receiver station through said repeater equipment; and an optical amplifying apparatus, for amplifying the optical signals, disposed in at least one of said transmitter station, said receiver station, and said repeater equipment, said optical amplifying apparatus comprising:

a first semiconductor layer having a first lattice constant;

a second semiconductor layer, having a second lattice constant, and formed on at least said first semiconductor layer, the second lattice constant of said second semiconductor layer being less than the first lattice constant of said first semiconductor layer, and said second semiconductor layer undergoing a biaxial tensile stress because of a lattice mismatch between said first semiconductor layer and said second semiconductor layer, and serving as a well layer for an active layer having a quantum well structure; and a third semiconductor layer, having a third lattice constant, and formed on at least said first semiconductor layer, the third lattice constant of said third semiconductor layer being less than the first lattice constant of said first semiconductor layer, and said third semiconductor layer undergoing a biaxial tensile stress because of a lattice mismatch between said first semiconductor layer and said third semiconductor layer, and serving as a barrier layer for the active layer having the quantum well structure.

9. A bidirection optical communication system comprising:

a plurality of transceiver stations for transmitting and receiving optical signals;

a transmission line, upon which the optical signals travel, for connecting said plurality of transceiver stations; and an optical amplifying apparatus, for amplifying the optical signals, disposed in at least one of said plurality of transceiver stations, said optical amplifying apparatus comprising:

a first semiconductor layer having a first lattice constant;

a second semiconductor layer, having a second lattice constant, and formed on at least said first semiconductor layer, the second lattice constant of said second semiconductor layer being less than the first lattice constant of said first semiconductor layer, and said second semiconductor layer undergoing a biaxial tensile stress because of a lattice mismatch between said first semiconductor layer and said second semiconductor layer, and serving as a well layer for an active layer having a quantum well structure; and a third semiconductor layer, having a third lattice constant, and formed on at least said first semiconductor layer, the third lattice constant of said third semiconductor layer being less than the first lattice constant of said first semiconductor layer, and said third semiconductor layer undergoing a biaxial tensile stress because of a lattice mismatch between said first semiconductor layer and said third semiconductor layer and serving as a barrier layer for the active layer having the quantum well structure.

10. A bidirectional optical communication system comprising:

a plurality of transceiver stations for transmitting and receiving optical signals;

a repeater equipment for amplifying the optical signals;

a transmission line, upon which the optical signals travel, for connecting said plurality of transceiver stations through said repeater equipment; and an optical amplifying apparatus, for amplifying the optical signals, disposed in at least one of said plurality of transceiver stations and said repeater equipment, said optical amplifying apparatus comprising:

a first semiconductor layer having a first lattice constant;

a second semiconductor layer, having a second lattice constant, and formed on at least said first semiconductor layer, the second lattice constant of said second semiconductor layer being less than the first lattice constant of said first semiconductor layer, and said second semiconductor layer undergoing a biaxial tensile stress because of a lattice mismatch between said first semiconductor layer and said second semiconductor layer, and serving as a well layer for an active layer having a quantum well structure; and a third semiconductor layer, having a third lattice constant, and formed on at least said first semiconductor layer, the third lattice constant of said third semiconductor layer being less than the first lattice constant of said first semiconductor layer, and said third semiconductor layer undergoing a biaxial tensile stress because of a lattice mismatch between said first semiconductor layer and said third semiconductor layer, and serving as a barrier layer for the active layer having the quantum well structure.

11. A bus-type optical communication network comprising:

a plurality of terminals, which transmit and receive electrical signals;

a plurality of transceiver stations, which are respectively connected to said plurality of terminals, for transmitting and receiving the electrical signals to and from their respective one of said plurality of terminals, and for performing optical communication among said said plurality of terminals;

at least one transmission line for connecting said plurality of transceiver stations; and an optical amplifying apparatus disposed in at least one of a light transmitting path from a light transmitter portion of any one of said plurality of transceiver stations to a light receiver portion of any one of said plurality of transceiver stations, said optical amplifying apparatus comprising:

a first semiconductor layer having a first lattice constant;

a second semiconductor layer, having a second lattice constant, and formed on at least said first semiconductor layer, the second lattice constant of said second semiconductor layer being less than the first lattice constant of said first semiconductor layer, and said second semiconductor layer undergoing a biaxial tensile stress because of a lattice mismatch between said first semiconductor layer and said second semiconductor layer, and serving as a well layer for an active layer having a quantum well structure; and a third semiconductor layer, having a third lattice constant, and formed on at least said first semiconductor layer, the third lattice constant of said third semiconductor layer being less than the first lattice constant of said first semiconductor layer, and said third semiconductor layer undergoing a biaxial tensile stress because of a lattice mismatch between said first semiconductor layer and said third semiconductor layer, and serving as a barrier layer for the active layer having the quantum well structure.

12. An active bus-type optical communication network comprising:

a plurality of terminals, which transmit and receive electrical signals;

a plurality of optical nodes, each of said optical nodes including, at least a plurality of means for transmitting a light signal, a plurality of means for receiving the light signal, and means for controlling communication, wherein said plurality of optical nodes transmit and receive the electrical signals to and from their respective one of said plurality of terminals;

a transmission line for connecting said plurality of optical nodes; and an optical amplifying apparatus, for amplifying the light signal, disposed in at least one of a light transmitting path from the light signal transmitting means in any one of said plurality of optical nodes to said light signal receiving means in any of said plurality of optical nodes, said optical amplifying apparatus comprising:

a first semiconductor layer having a first lattice constant;

a second semiconductor layer, having a second lattice constant, and formed on at least said first semiconductor layer, the second lattice constant of said second semiconductor layer being less than the first lattice constant of said first semiconductor layer, and said second semiconductor layer undergoing a biaxial tensile stress because of a lattice mismatch between said first semiconductor layer and said second semiconductor layer, and serving as a well layer for an active layer having a quantum well structure; and a third semiconductor layer, having a third lattice constant, and formed on at least said first semiconductor layer, the third lattice constant of said third semiconductor layer being less than the first lattice constant of said first semiconductor layer, and said third semiconductor layer undergoing a biaxial tensile stress because of a lattice mismatch between said first semiconductor layer and said third semiconductor layer, and serving as a barrier layer for the active layer having the quantum well structure.

13. A star-type optical communication network comprising:

a plurality of transceiver stations, each of said transceiver stations including a light transmitter portion for transmitting optical signals and a light receiver portion for receiving the optical signals;

a star coupler, which connects the optical signals between said plurality of transceiver stations;

a transmission line, upon which the optical signals travel, for connecting said star coupler to said plurality of transceiver stations; and an optical amplifying apparatus, for amplifying the optical signals, disposed in at least one location on a light transmitting path within said plurality of transceiver stations and along said transmission line, said optical amplifying apparatus comprising:

a first semiconductor layer having a first lattice constant;

a second semiconductor layer, having a second lattice constant, and formed on at least said first semiconductor layer, the second lattice constant of said second semiconductor layer being less than the first lattice constant of said first semiconductor layer, said second semiconductor layer undergoing a biaxial tensile stress because of a lattice mismatch between said first semiconductor layer and said second semiconductor layer, and serving as a well layer for an active layer having a quantum well structure; and a third semiconductor layer, having a third lattice constant, and formed on at least said first semiconductor layer, the third lattice constant of said third semiconductor layer being less than the first lattice constant of said first semiconductor layer, and said third semiconductor layer undergoing a biaxial tensile stress because of a lattice mismatch between said first semiconductor layer and said third semiconductor layer, and serving as a barrier layer for the active layer having the quantum well structure.

14. A loop-type optical communication network comprising:

a plurality of stations, each one of said stations including a light transmitter portion and a light receiver portion;

a transmission line for connecting said plurality of stations; and an optical amplifying apparatus disposed in at least one of a light transmitting path within said plurality of stations and along said transmission line, said optical amplifying apparatus comprising:

a first semiconductor layer having a first lattice constant;

a second semiconductor layer, having a second lattice constant, and formed on at least said first semiconductor layer, the second lattice constant of said second semiconductor layer being less than the first lattice constant of said first semiconductor layer, and said second semiconductor layer undergoing a biaxial tensile stress because of a lattice mismatch between said first semiconductor layer and said second semiconductor layer, and serving as a well layer for an active layer having a quantum well structure; and a third semiconductor layer, having a third lattice constant, and formed on at least said first semiconductor layer, the third lattice constant of said third semiconductor layer being less than the first lattice constant of said first semiconductor layer, and said third semiconductor layer undergoing a biaxial tensile stress because of a lattice mismatch between said first semiconductor layer and said third semiconductor layer, and serving as a barrier layer for the active layer having the quantum well structure.

* * * * *

UNITED STATES PATENT AND TRADEMARK OFFICE
CERTIFICATE OF CORRECTION

PATENT NO. : 5,388,117
DATED : February 7, 1995
INVENTOR(S) : MICHIYO NISHIMURA

It is certified that error appears in the above-indentified patent and that said Letters Patent is hereby corrected as shown below:

ON THE TITLE PAGE:

AT [56] REFERENCES CITED

FOREIGN PATENT DOCUMENTS,
"1251685" should read --1-251685--.
"1257386" should read --1-257386--.
" 427183" should read --4-27183--.

COLUMN 4:

Line 42, "of light" should read --of a light--.

COLUMN 7:

Line 20, "devices" should read --device's--.

COLUMN 8:

Line 31, "is than" should read --is greater than--.

COLUMN 9:

Line 47, "line 118" should read --lines 118--.

UNITED STATES PATENT AND TRADEMARK OFFICE
CERTIFICATE OF CORRECTION

PATENT NO. : 5,388,117
DATED : February 7, 1995
INVENTOR(S) : MICHIYO NISHIMURA

It is certified that error appears in the above-indentified patent and that said Letters Patent is hereby corrected as shown below:

COLUMN 15:

Line 11, "above mentioned" should read --above-mentioned--.

COLUMN 19:

Line 34, "bidirection" should read --bidirectional--.

Signed and Sealed this

Fourth Day of July, 1995

*Attest:*

BRUCE LEHMAN

*Attesting Officer*     *Commissioner of Patents and Trademarks*